(12) United States Patent
Xiao et al.

(10) Patent No.: US 8,089,297 B2
(45) Date of Patent: Jan. 3, 2012

(54) STRUCTURE AND METHOD FOR DETERMINING A DEFECT IN INTEGRATED CIRCUIT MANUFACTURING PROCESS

(75) Inventors: Hong Xiao, Pleasanton, CA (US); Jack Jau, Los Altos Hills, CA (US); Chang Chun Yeh, Hsinchu (TW)

(73) Assignee: Hermes-Microvision, Inc., Hsinchu (TW)

( * ) Notice: Subject to any disclaimer, the term of this patent is extended or adjusted under 35 U.S.C. 154(b) by 510 days.

(21) Appl. No.: 12/110,147

(22) Filed: Apr. 25, 2008

(65) Prior Publication Data

US 2008/0265251 A1 Oct. 30, 2008

Related U.S. Application Data

(60) Provisional application No. 60/914,020, filed on Apr. 25, 2007, provisional application No. 60/940,165, filed on May 25, 2007.

(51) Int. Cl.
*G01R 31/02* (2006.01)
*G01R 31/26* (2006.01)
(52) U.S. Cl. .............. 324/762.02; 324/762.01
(58) Field of Classification Search ............ 324/762.01, 324/762.02, 762.03
See application file for complete search history.

(56) References Cited

U.S. PATENT DOCUMENTS

| 6,949,765 | B2* | 9/2005 | Song et al. ............ 257/48 |
| 7,656,170 | B2* | 2/2010 | Pinto et al. ............ 324/754.22 |
| 7,747,063 | B2 | 6/2010 | Lim et al. |
| 2003/0136762 | A1* | 7/2003 | Zhao et al. ............ 216/59 |
| 2003/0155927 | A1* | 8/2003 | Pinto et al. ............ 324/501 |
| 2005/0139767 | A1* | 6/2005 | Pinto et al. ............ 250/307 |
| 2005/0152594 | A1 | 7/2005 | Jau et al. |
| 2008/0061805 | A1* | 3/2008 | Whitefield ............ 324/751 |
| 2008/0237487 | A1* | 10/2008 | Pinto et al. ............ 250/492.1 |
| 2009/0017564 | A1* | 1/2009 | Ramappa ............ 438/14 |
| 2009/0179161 | A1* | 7/2009 | Ward et al. ............ 250/492.21 |
| 2009/0272901 | A1* | 11/2009 | Hayashi et al. ............ 250/307 |

* cited by examiner

*Primary Examiner* — Fernando L Toledo
(74) *Attorney, Agent, or Firm* — Sawyer Law Group, P.C.

(57) ABSTRACT

The present invention discloses a structure and method for determining a defect in integrated circuit manufacturing process, wherein the structure comprises a plurality of normal active areas formed in a plurality of first arrays and a plurality of defective active areas formed in a plurality of second arrays. The first arrays and second arrays are interlaced, and the defect is determined by monitoring a voltage contrast from a charged particle microscope image of the active areas.

9 Claims, 12 Drawing Sheets

STRUCTURE AND METHOD FOR DETERMINING A DEFECT IN INTEGRATED CIRCUIT MANUFACTURING PROCESS

CROSS-REFERENCE TO RELATED APPLICATIONS

This Application is the U.S. Non-Provisional Patent application of U.S. Provisional Patent Application No. 60/914,020 filed on Apr. 25, 2007 entitled, "Test Structures For Manufacturing Process Monitoring Using Charged Particle Beam System" and U.S. Provisional Patent Application No. 60/940,165 filed on May 25, 2007 entitled, "Test Structures for Monitoring Electrical Short and Open Between Contact Plugs with Charged Particle Beam System" the priority of which is hereby claimed, and the entirety of which is incorporated herein by this reference.

FIELD OF THE INVENTION

The present invention relates generally to the integrated circuit manufacturing process using a particle beam system, in particular to a test structure and method for determining a defect in integrated circuit manufacturing process.

BACKGROUND OF THE INVENTION

Charged particle beam systems such as electron beam inspection (EBI) systems are increasingly applied in advanced integrated circuit chip manufacturing. The system has high resolution that can be used to detect tiny physical defects that beyond the capability of optical defect inspection systems. Another advantage of EBI is that it can detect voltage contrast (VC) defects of electrical circuitry such as open circuit, short circuit or leakage underneath the wafer surface because of surface charge induced gray level (GL) variation.

In dynamic random access memory (DRAM) manufacturing, piping defects can be formed when there are voids or keyholes between word lines (WL) during inter-layer dielectric (ILD) deposition process. Conducting material such as polysilicon that fills the contact holes also fills the voids or keyholes between the neighboring contact plugs in the ILD, which causes electrical short between neighboring contact plugs This defect is very difficult to detect for non-annealed polysilicon plugs. Sometimes it requires a destructive polysilicon anneal process to enable EBI system to detect piping defect. Piping issue will become more challenging when DRAM feature size continues to shrink and the aspect ratio of the gap between WL becomes even larger.

SUMMARY OF THE INVENTION

A structure and method for determining a defect in integrated circuit manufacturing process is disclosed. Defective microelectronics devices can be created in a test structure to monitor integrated circuit manufacturing process with a charged particle beam system. One objective of the disclosed test structure with modulated normal and defective devices are designed to detect electrical short between contact plugs, so called piping defect. The modulation of the devices can be every another row, every another two rows, every another column, or every another tow columns, etc.

In one aspect, a method for determining a defect in integrated circuit manufacturing process is disclosed. The method comprises the steps of providing a plurality of normal active areas on a sample; placing a plurality of defective active areas on the sample, wherein the normal active areas and defective active areas are interlaced; obtaining a charged particle microscope image, such as scanning electron microscope (SEM) image, of the sample; and determining the defect on the sample from the charged particle microscope image.

The defect may be a void-induced short or a non-open contact of the normal active areas. The active areas may be active areas of semiconductor devices. Preferably, the plurality of normal active areas are formed in a plurality of first arrays and the plurality of detective active areas are formed in a plurality of second arrays, wherein the arrangement of the first and second arrays can be as one or any combination of the following: every two of the second arrays being spaced apart by at least one of the first arrays; every two of the first arrays being spaced apart by at least one of the second arrays; at least two of the first arrays being formed side by side; and at least two of the second arrays being formed side by side.

DETAILED DESCRIPTION

The present invention relates generally to the integrated circuit manufacturing process using a particle beam system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a system and method in accordance with the present invention integrated circuit devices are designed to leak or short circuit by intentionally doping certain species in ion implantation processes that form wells, channels, source/drain (S/D) and pockets. These devices can then be used as a reference pattern for gray level measurement to monitor device leakage in front end of line (FEoL) process control.

Figure 1:
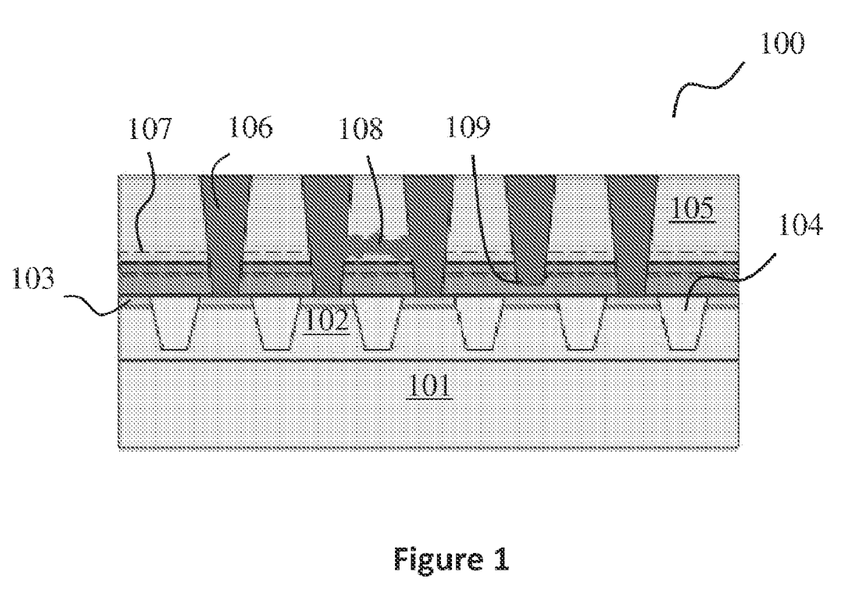
FIG. 1 is an illustration of the piping and open defects of DRAM landing pad plug (LPP) layer.

FIG. 1 illustrates a semiconductor device 100 having the piping defect 108 between two polysilicon landing pad plugs (LPP) 106 caused by void between word lines (WL) 107. It also illustrates a contact open 109 of the polysilicon landing pad plugs 106 which is also a killer defect. As shown, the semiconductor device also comprises a p-type doped substrate 101, a p-type doped well 102, a heavily n-type doped (N+) source/drain 103, a shallow trench isolation (STI) 104, and an interlay dielectric (ILD) layer 105.

Figure 2A:
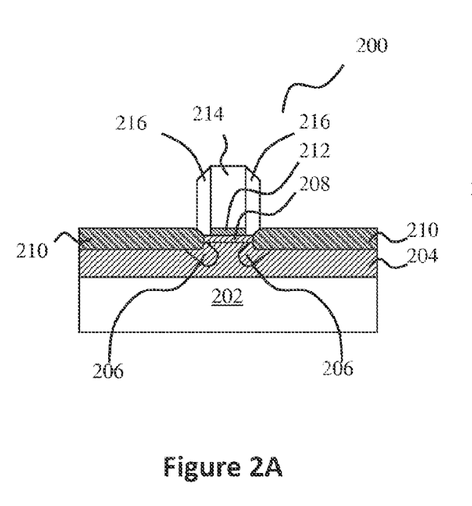
FIG. 2A is a cross-section view of a normal p-type doped metal-oxide-semiconductor (PMOS) device.
Figure 2B:
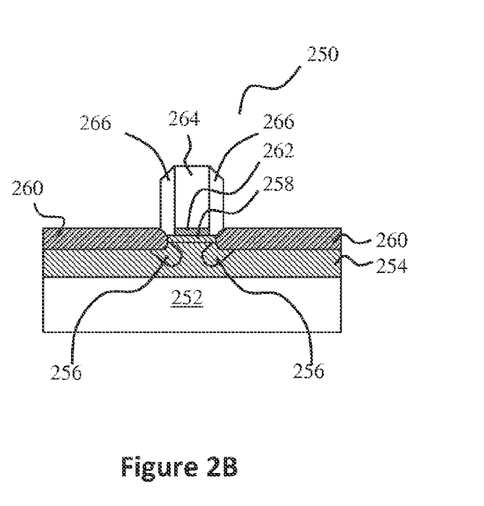
FIG. 2B is a cross-section view of a normal n-type doped metal-oxide-semiconductor (NMOS) device.

FIG. 2A illustrates a cross-section of a normal p-type doped metal-oxide-semiconductor (PMOS) device 200. The PMOS device 200 comprises a p-type doped substrate 202, a n-type doped well 204, n-type doped pockets 206, a n-type doped channel 208, heavily p-type doped (P+) source and drain (S/D) 210, a very thin layer of gate dielectric 212, a conducting gate electrode 214 and sidewall spacers 216. FIG. 2B illustrates a cross-section of a normal n-type doped metal-oxide-semiconductor (NMOS) device 250. The NMOS device 250 comprises a p-type doped substrate 252, a p-type doped well 254, p-type doped pockets 256, a p-type doped channel 258, heavily n-type doped S/D 260, a very thin layer of gate dielectric 262, a conducting gate electrode 264 and sidewall spacers 266.

By replacing p-type doped well implantation with n-type doped well implantation, devices with S/D-to-well short (N+/N-well) can be created for devices with n-type doped S/D. These defective devices cause bright voltage contrast (BVC) of polysilicon plugs connected thereto, as the polysilicon plugs are connected to a virtual ground when the n-type doped well is a large common well.

Figure 3A:
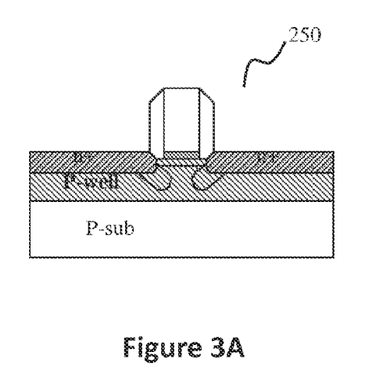
FIG. 3A is a cross-section view of a normal NMOS device.
Figure 3B:
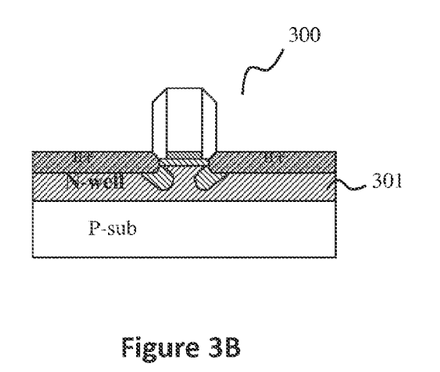
FIG. 3B is an illustration of NMOS device with S/D-to-well short.
Figure 3C:
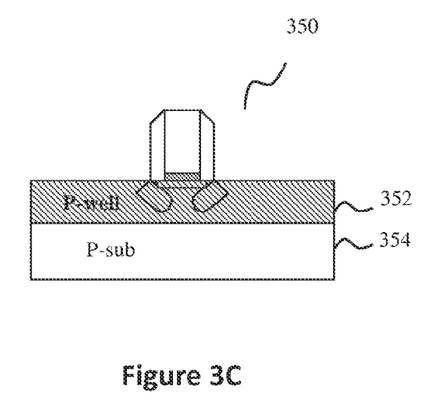
FIG. 3C shows a defective device with p-type doped substrate, p-type doped well and with no S/D implantation (P-well/P-substrate)

FIG. 3A illustrates a cross-section of a normal NMOS device 250 again (same as FIG. 2B). FIG. 3B shows a NMOS device 300 with S/D-to-well short (N+/N-well) by intentionally using wrong well implantation species 301. Instead of implantation of p-type doped dopant such as boron, the n-type doped dopants such as phosphorus are implanted in the well. FIG. 3C shows a defective device 350 with p-type doped substrate 354 and p-type doped well 352. There is no S/D in the defective device 350 and it was performed by intentionally skipping N+ S/D ion implantation.

The present invention discloses a method for determining a defect in integrated circuit manufacturing process, which comprises the steps of providing a plurality of normal active areas on a sample; placing a plurality of defective active areas on the sample wherein the normal active areas and defective active areas are interlaced; obtaining a charged particle microscope image of the sample; and determining the defect on the sample from the charged particle microscope image.

The defect may be a void-induced short or a non-open contact of the normal active areas. For instance, the void-induced short can be determined by monitoring the bright voltage contrast image of the active areas from the charged particle microscope image, and the non-open contact can be determined by monitoring the dark voltage contrast image of the active areas that has large voltage contrast difference from the charged particle microscope image. On the other hand, the sample may comprise a dynamic random access memory and the charged particle microscope image may comprise a scanning electron microscope image.

The active areas may be active areas of semiconductor devices. For instance, the normal active areas may be active areas of semiconductor devices having heavily n-type doped source and drain and p-type doped well (N+/P-well), while the defective active areas may be active areas of semiconductor devices having heavily p-type doped source and drain, and p-type doped well (P+/P-well), or active areas of semiconductor devices having heavily n-type doped source and drain and n-type doped well (N+/N-well). Further the defective active area may be active areas of semiconductor devices having p-type doped source and drain and n-type doped well (P+/N-well), or active areas of semiconductor devices having p-type doped well (P-well) and undoped source and drain, or active areas of semiconductor devices having n-type doped well (N-well) and undoped source and drain. Finally, the defective active areas may be active areas of semiconductor devices having p-type doped substrate.

In one example of this embodiment, the plurality of normal active areas are formed in a plurality of first arrays and the plurality of detective active areas are formed in a plurality of second arrays, wherein the arrangement of the first and second arrays can be as one or any combination of the following: every two of the second arrays being spaced apart by at least one of the first arrays; every two of the first arrays being spaced apart by at least one of the second arrays; at least two of the first arrays being formed side by side; and at least two of the second arrays being formed side by side.

Figure 4:
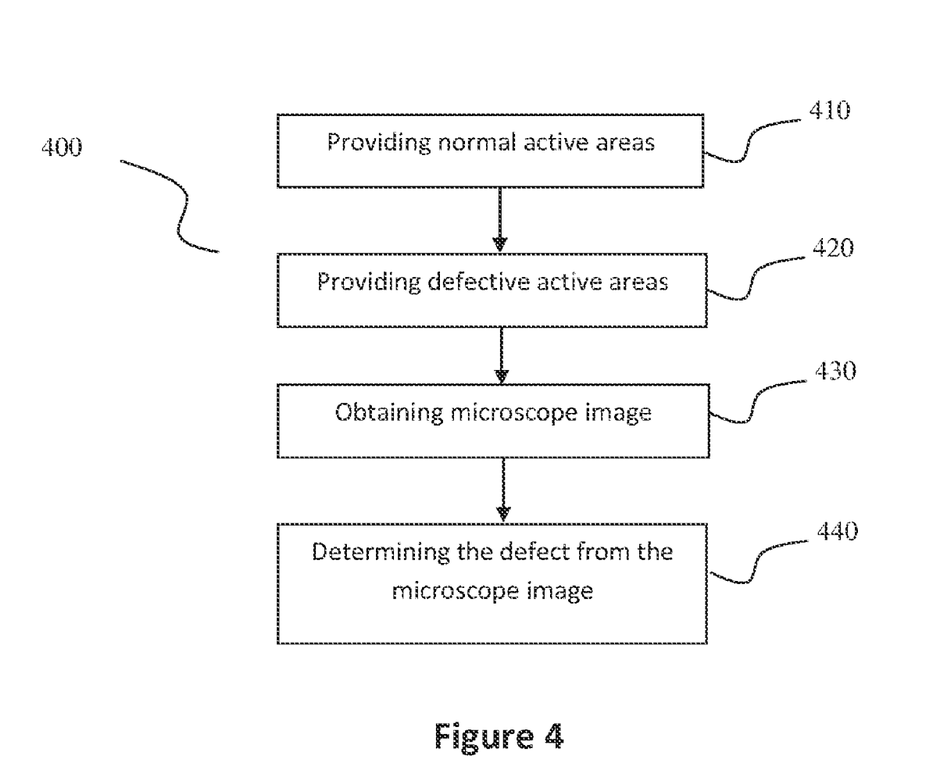
FIG. 4 is a flow chart illustrating the method disclosed by the present invention.

FIG. 4 is a flow chart 400 illustrating the disclosed method in accordance with the present invention. As shown, firstly a plurality of normal active areas are provided (410). Next, a plurality of defective active areas are provided (420). A charged particle microscope, such as SEM, image is then obtained and used for determination of the target defects (430, 440).

A test structure in accordance with the present invention is disclosed for determining a defect in integrated circuit manufacturing process. The disclosed test structure comprises a plurality of normal active areas formed in a plurality of first arrays and a plurality of defective active areas formed in a plurality of second arrays, wherein the first and second arrays are interlaced, and the defect is determined by monitoring a voltage contrast from a charged particle microscope image of the active areas.

The defect may be a void-induced short or a non-open contact of the normal active areas. For instance, the void-induced short can be determined by monitoring the bright voltage contrast image of the active areas from the charged particle microscope image, and the non-open contact can be determined by monitoring the dark voltage contrast image of the active areas that has large voltage contrast difference from the charged particle microscope image. On the other hand, the sample may comprise a dynamic random access memory and the charged particle microscope image may comprise a scanning electron microscope image.

The active areas may be active areas of semiconductor devices. For instance, the normal active areas may be active areas of semiconductor devices having heavily n-type doped source and drain and p-type doped well (N+/P-well), while the detective active areas may be active areas of semiconductor devices having heavily p-type doped source and drain, and p-type doped well (P+/P-well), or active areas of semiconductor devices having heavily n-type doped source and drain and n-type doped well (N+/N-well). Further the defective active areas may be active areas of semiconductor devices having p-type doped source and drain and n-type doped well (P+/N-well. Finally, the defective active areas may be active areas of semiconductor devices having p-type doped well (P-well) and undoped source and drain, or active areas of semiconductor devices having n-type doped well (N-well) and undoped source and drain, or active areas of semiconductor devices having p-type doped substrate.

The arrangement of the first and second arrays can be as one or any combination of the following: every two of the second arrays being spaced apart by at least one of the first arrays; every two of the first arrays being spaced apart by at least one of the second arrays; at least two of the first arrays being formed side by side; and at least two of the second arrays being formed side by side.

Figure 5A:
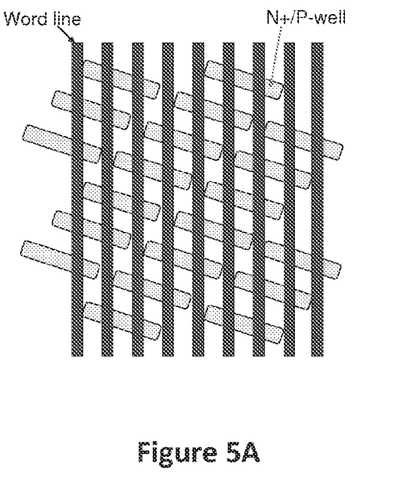
FIG. 5A is an illustration of a normal DRAM cell.
Figure 5B:
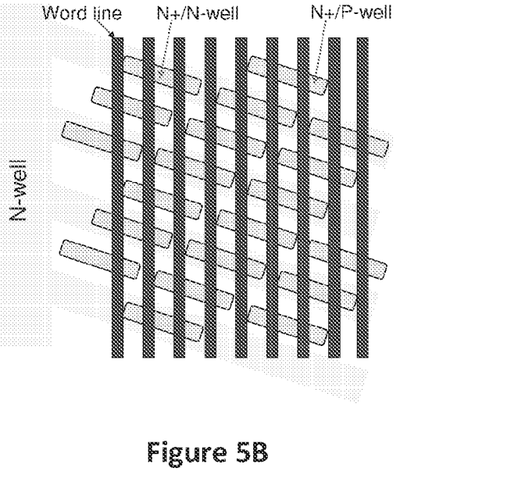
FIG. 5B is an illustration of a test pattern in accordance with one example of the present invention.
Figure 7A:
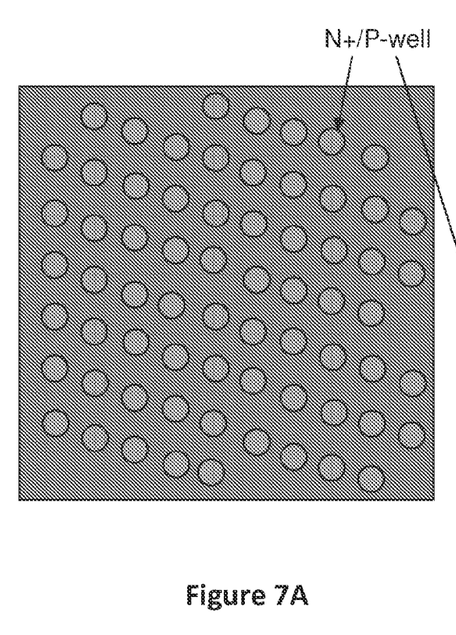
FIG. 7A is an illustration of expected voltage contrast of polysilicon plugs in a DRAM cell of FIG. 5A.
Figure 7B:
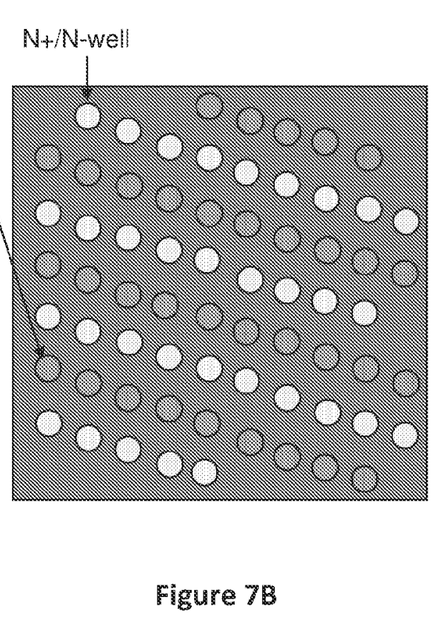
FIG. 7B is an illustration of expected voltage contrast of polysilicon plugs connected to the test pattern of FIG. 5B.

Reference is now made to FIGS. 5A and 5B and FIGS. 7A and 7B for an example of the present invention. The test structure in FIG. 5B is a DRAM cell having S/D-to-well short (N+/N-well) in every another row of the active areas. As shown in FIG. 7B, this test structure has modulated voltage contrast variation of conducting plugs, such as polysilicon plugs. In comparison, FIG. 7A shows conducting plugs, such as polysilicon plugs with very little voltage contrast difference in a normal DRAM cell as illustrated in FIG. 5A.

Figure 6A:
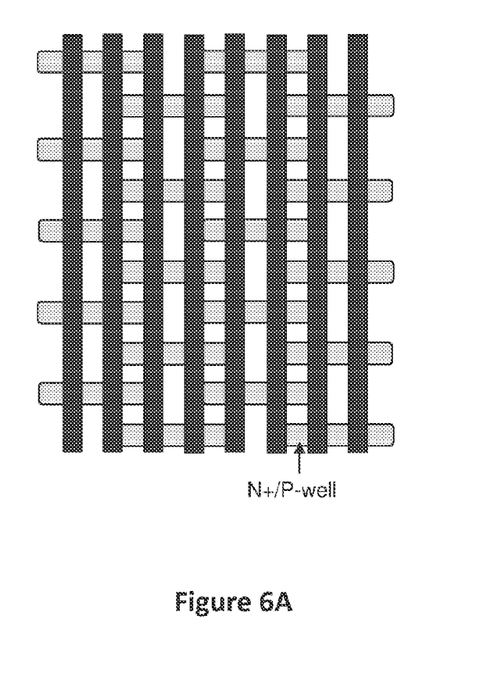
FIG. 6A is an illustration of a normal DRAM cell.
Figure 6B:
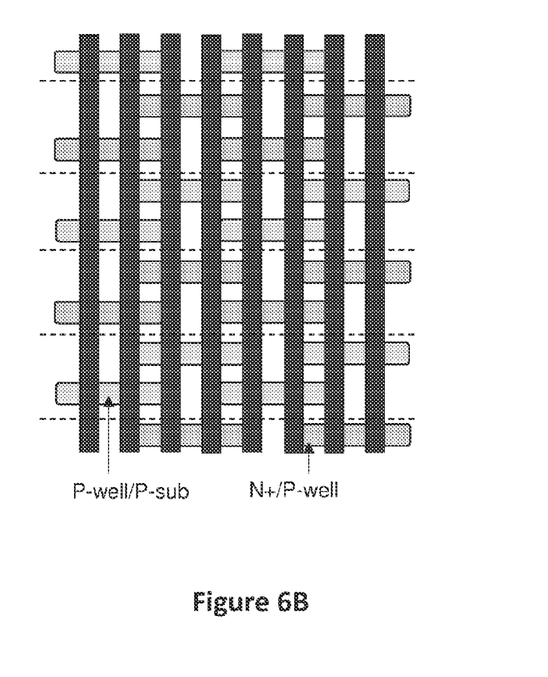
FIG. 6B is an illustration of a test pattern in accordance with another example of the present invention.
Figure 8A:
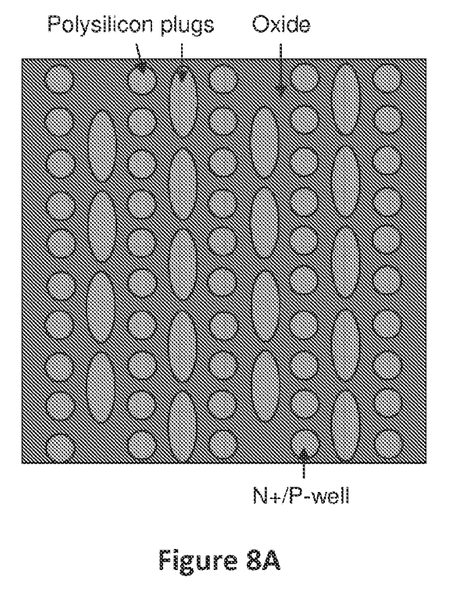
FIG. 8A is an illustration of expected voltage contrast of polysilicon plugs in a DRAM cell of FIG. 6A.
Figure 8B:
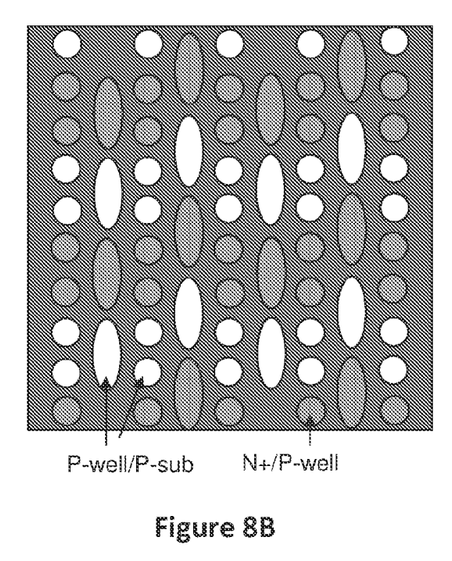
FIG. 8B is an illustration of expected voltage contrast of polysilicon plugs connected to the test pattern of FIG. 6B.

Reference is now made to FIGS. 6A and 6B and FIGS. 8A and 8B for another example of the present invention. The test structure in FIG. 6B is a DRAM cell having p-type doped substrate, p-type doped well and no S/D ion implantation (P-well/P-substrate) in every another two rows of the active areas. As shown in FIG. 8B, this test structure has modulated voltage contrast variation of conducting plugs, such as polysilicon plugs. In comparison. FIG. 8A shows conducting plugs, such as polysilicon plugs with very little voltage contrast difference in a normal DRAM cell as illustrated in FIG. 6A.

Figure 9A:
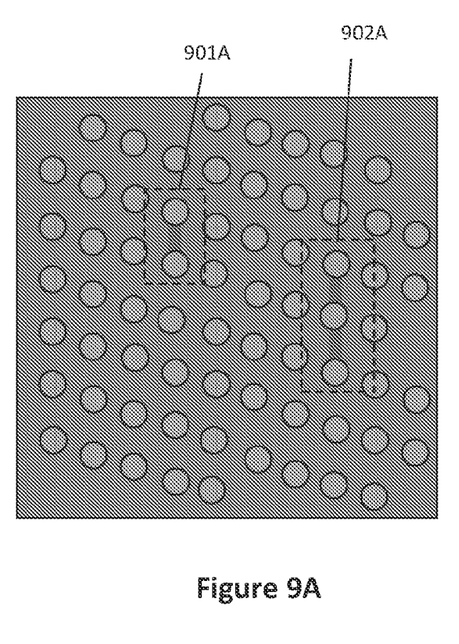
FIG. 9A is an illustration of expected voltage contrast of non-annealed polysilicon plugs in a DRAM cell shown in FIG. 5A with piping defects.
Figure 9B:
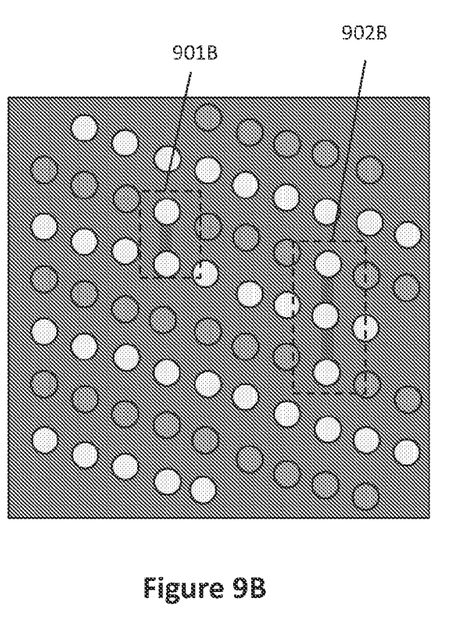
FIG. 9B is an illustration of expected voltage contrast of non-annealed polysilicon plugs in the test pattern shown in FIG. 5B with piping defects.

It is very difficult to detect LPP piping defect in normal DRAM cell illustrated in FIG. 5A. This is because there is very small voltage contrast variation of normal and defected plugs, as the dotted line regions 901A and 902A shown in FIG. 9A. It is much easier to detect piping defects as bright voltage contrast (BVC) defect using the test structure illustrated in FIG. 5B. The defect detection image with corresponding dotted line regions 901B and 902B is shown in FIG. 9B.

Figure 10A:
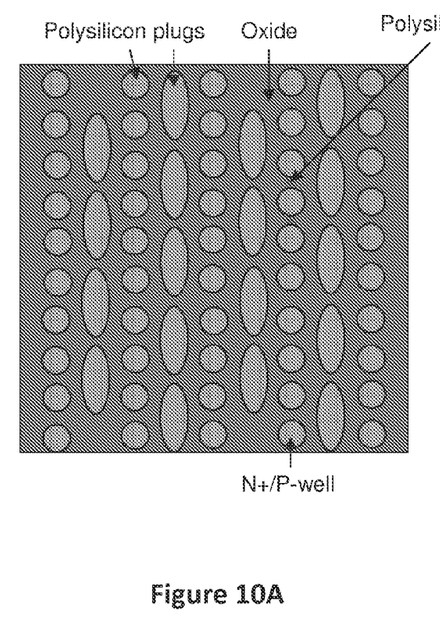
FIG. 10A is an illustration of expected voltage contrast of non-annealed polysilicon plugs in a DRAM cell shown in FIG. 6A with piping defects.
Figure 10B:
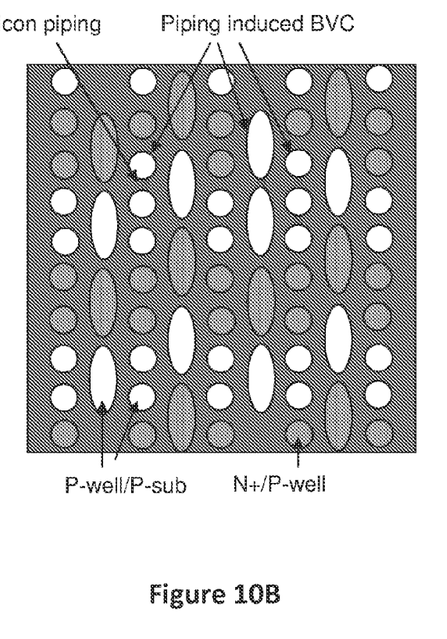
FIG. 10B is an illustration of expected voltage contrast of non-annealed polysilicon plugs in the test pattern shown in FIG. 6B with piping defects.

Similarly, it is very difficult to detect LPP piping defect in normal DRAM cell illustrated in FIG. 6A. This is because there is very small voltage contrast variation of normal and defected plugs, as shown in FIG. 10A. It is much easier to detect piping defects as BVC defect using the test structure illustrated in FIG. 6B. The defect detection image is shown in FIG. 10B.

Figure 11A:
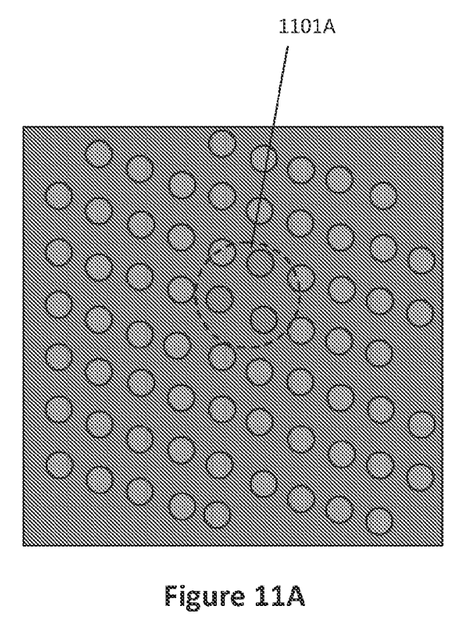
FIG. 11A is an illustration of expected dark voltage contrast of non-annealed polysilicon plugs in a DRAM cell shown in FIG. 5A with contact open defects.
Figure 11B:
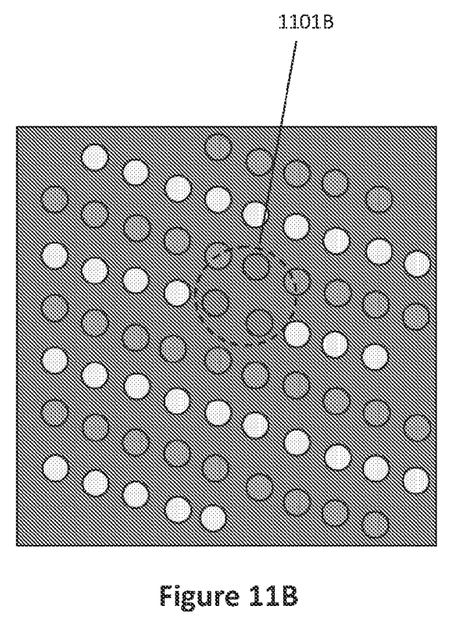
FIG. 11B is an illustration of expected dark voltage contrast of non-annealed polysilicon plugs in the test pattern shown in FIG. 5B with contact open defects.

The structure illustrated in FIG. 5B can also help to detect contact open defects. FIG. 11A illustrates contact open defects 1101A in the normal DRAM cell of FIG. 5A. The contact open defects show dark voltage contrast (DVC) and have very small voltage contrast difference. On the contrary, resulting from FIG. 5B, FIG. 11B shows strong voltage contrast difference of the open defects in plugs that connect to N+/N-well (1101B).

Figure 12A:
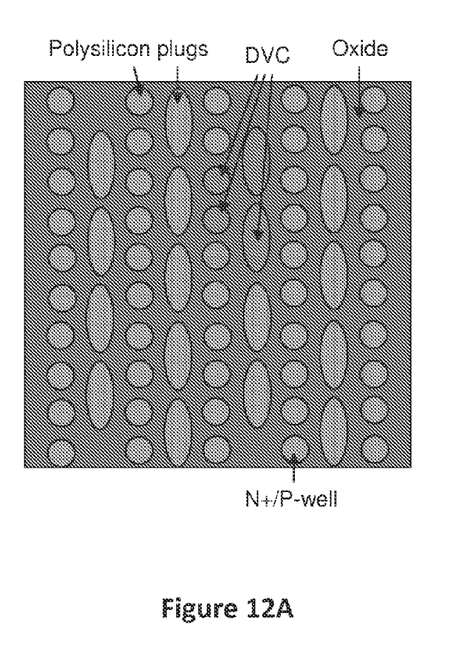
FIG. 12A is an illustration of expected voltage contrast of non-annealed polysilicon plugs in a DRAM cell shown in FIG. 6A with contact open defects.
Figure 12B:
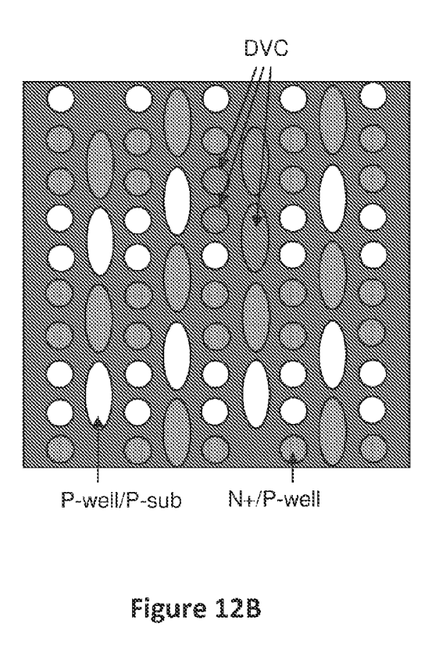
FIG. 12B is an illustration of expected voltage contrast of non-annealed polysilicon plugs in the test pattern shown in FIG. 6B with contact open defects.

Similarly, FIG. 12A illustrates contact open defects in the normal DRAM cell of FIG. 6A. The contact open defects show dark voltage contrast (DVC) and have very small voltage contrast difference. On the contrary, resulting from FIG. 6B, FIG. 12B shows strong voltage contrast difference of the open defects in plugs that connect to P-well/P-substrate.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A test structure for determining a defect in integrated circuit manufacturing process, comprising:
    a plurality of normal active areas formed in a plurality of first arrays on a die; and
    a plurality of defective active areas formed in a plurality of second arrays on the die, wherein said first arrays and said second arrays are interlaced,
    wherein said defect is determined by monitoring a voltage contrast from a charged particle microscope image of said active areas.

2. The test structure for determining a defect of claim 1, wherein said defect is a void-induced short of said normal active areas or a non-open contact of said normal active areas.

3. The test structure for determining a defect of claim 2, wherein said void-induced short is determined by monitoring the bright voltage contrast image of said active areas.

4. The test structure for determining a defect of claim 2, wherein said non-open contact is determined by monitoring the dark voltage contrast image of said active areas that has large voltage contrast difference.

5. The test structure for determining a defect of claim 1, wherein said active areas are active areas on the die of semiconductor devices.

6. The test structure for determining a defect of claim 5, wherein said normal active areas are active areas of semiconductor devices having heavily n-type doped source and drain, and p-type doped well (N+/P-well).

7. The test structure for determining a defect of claim 5, wherein said detective active areas are active areas of semiconductor devices having heavily p-type doped source and drain with p-type doped well (P+/P-well), heavily n-type doped source and drain with n-type doped well (N+/N-well), heavily p-type doped source and drain with n-type doped well (P+/N-well), p-type doped well (P-well/P-substrate), n-type doped well (N-well/P-substrate), or p-type doped substrate.

8. The test structure for determining a defect of claim 1, wherein every two of said first arrays or second arrays on the die are spaced apart by at least one of said second arrays.

9. The test structure for determining a defect of claim 1, wherein at least two of said first arrays or second arrays on the die are formed side by side.

* * * * *